United States Patent
Karda et al.

(10) Patent No.: US 11,594,644 B2
(45) Date of Patent: Feb. 28, 2023

(54) MICROELECTRONIC DEVICES INCLUDING PASSIVATION MATERIALS, RELATED ELECTRONIC DEVICES, AND RELATED METHODS

(71) Applicant: Micron Technology, Inc., Boise, ID (US)

(72) Inventors: Kamal M. Karda, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 301 days.

(21) Appl. No.: 16/682,617

(22) Filed: Nov. 13, 2019

(65) Prior Publication Data

US 2021/0143284 A1    May 13, 2021

(51) Int. Cl.
*H01L 29/786* (2006.01)
*H01L 29/66* (2006.01)

(52) U.S. Cl.
CPC .... *H01L 29/78696* (2013.01); *H01L 29/6675* (2013.01); *H01L 29/66666* (2013.01); *H01L 29/7869* (2013.01)

(58) Field of Classification Search
CPC ......... H01L 29/78696; H01L 29/66666; H01L 29/6675; H01L 29/78642; H01L 29/7869
See application file for complete search history.

(56) References Cited

U.S. PATENT DOCUMENTS

| | | | |
|---|---|---|---|
| 6,815,805 B2 | 11/2004 | Weimer | |
| 8,299,516 B2 | 10/2012 | Weng et al. | |
| 8,895,979 B2 | 11/2014 | Chang et al. | |
| 9,082,793 B1 | 7/2015 | Ahmed | |
| 9,129,859 B2 * | 9/2015 | Liu | .................... H01L 29/66825 |
| 9,177,872 B2 * | 11/2015 | Sandhu | ............... H01L 21/8254 |
| 9,246,013 B2 | 1/2016 | Ahmed | |

(Continued)

FOREIGN PATENT DOCUMENTS

| KR | 10-2018-0070768 A | 6/2018 |
|---|---|---|
| WO | 2018/063308 A1 | 4/2018 |

(Continued)

OTHER PUBLICATIONS

Billah et al., TCAD Simulation of Dual-Gate a-IGZO TFTs with Source and Drain Offsets, IEEE ELectron Device Letters, vol. 37, No. 11, (Nov. 2016), pp. 1442-1445.

(Continued)

*Primary Examiner* — Jonathan Han
(74) *Attorney, Agent, or Firm* — TraskBritt

(57) ABSTRACT

A microelectronic device comprises a conductive line and a transistor adjacent to the conductive line. The transistor comprises a channel material extending into the conductive line, the channel material contacting the conductive line in three dimensions, a dielectric material adjacent to the channel material, a conductive material adjacent to the dielectric material, and a passivation material adjacent to the channel material. The microelectronic device further comprises a conductive contact adjacent to the channel material, the conductive contact including a portion extending between opposing portions of the channel material. Related microelectronic devices, electronic devices, and related methods are also disclosed.

27 Claims, 6 Drawing Sheets

(56) References Cited

U.S. PATENT DOCUMENTS

| | | |
|---|---|---|
| 9,397,145 B1 | 7/2016 | Sills et al. |
| 9,773,888 B2 | 9/2017 | Pulugurtha et al. |
| 2005/0001218 A1 | 1/2005 | Hackler et al. |
| 2010/0213538 A1* | 8/2010 | Fukuzumi ............... G11C 5/02 |
| | | 257/326 |
| 2016/0079385 A1 | 3/2016 | Ellinger et al. |
| 2016/0027804 A1 | 11/2016 | Li et al. |
| 2018/0053843 A1 | 2/2018 | Anderson et al. |
| 2018/0090679 A1 | 3/2018 | Sills et al. |
| 2018/0358380 A1* | 12/2018 | Yoo ................... H01L 29/40111 |
| 2018/0366545 A1 | 12/2018 | Deng et al. |
| 2019/0067475 A1 | 2/2019 | Liu et al. |

FOREIGN PATENT DOCUMENTS

| | | |
|---|---|---|
| WO | 2019/066912 A1 | 4/2019 |
| WO | WO-2019132905 A1 * | 7/2019 |

OTHER PUBLICATIONS

Karda et al., U.S. Appl. No. 16/596,090 titled Devices Including Vertical Transistors, and Related Methods, filed Oct. 8, 2019.
Liu et al., Highly Flexible Electronics from Scalable Vertical Thin Film Transistors, Nano Letters, vol. 14, (2014), pp. 1413-1418.
Petti et al., Flexible Quasi-Vertical In=Ga—Nz—O Thin-Film Transistor with 300-nm Channel Length, IEEE Electron Device Letters, vol. 36, No. 5, (May 2015), pp. 475-477.
Yoon et al., Effects of Deposition Temperature on the Device Characteristics of Oxide Thin-Film Transistors Using In—Ga—Zn—O Active Channels Prepared by Atomic-Layer Deposition, ACS Applied Materials & Interfaces, vol. 9, (2017), pp. 22676-22684.
Zheng et al., All-Sputtered, Flexible, Bottom-Gate IGZO/Al2O3 Bi-LayerThin Film Transistors on PEN Fabricated by a Fully Room Temperature Process, Journal of Materials Chemistry C, vol. 5, (2017), pp. 7043-7050.
International Search Report for Application No. PCT/US2020/057864, dated Feb. 9, 2021, 3 pages.
Written Opinion of the International Searching Authority for Application No. PCT/US2020/057864, dated Feb. 9, 2021, 4 pages.

\* cited by examiner

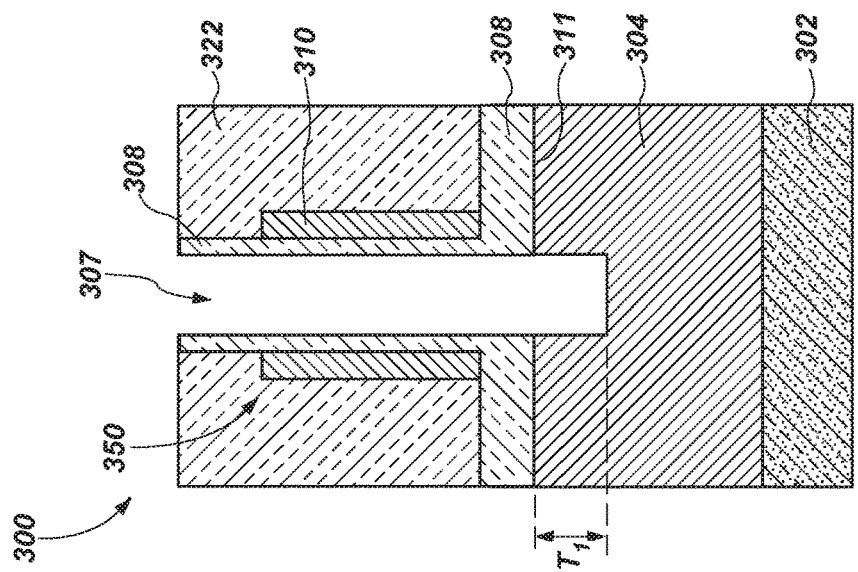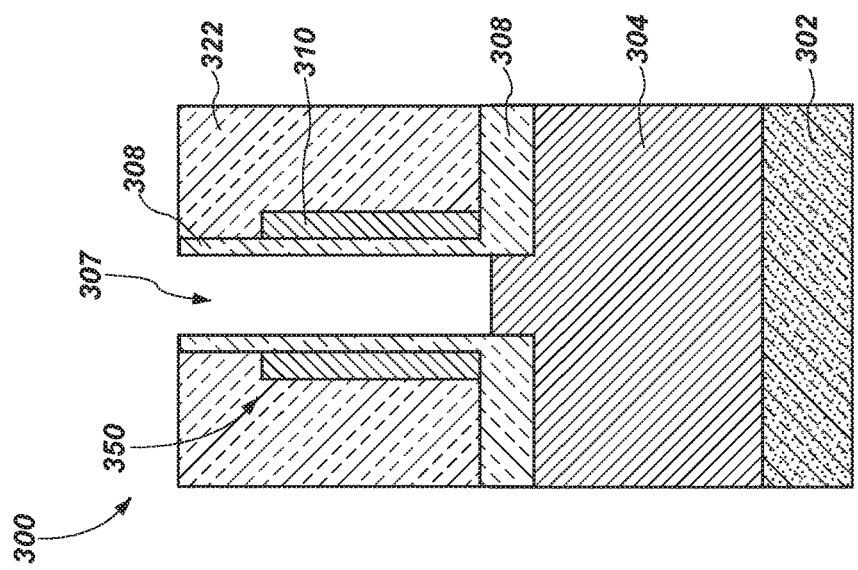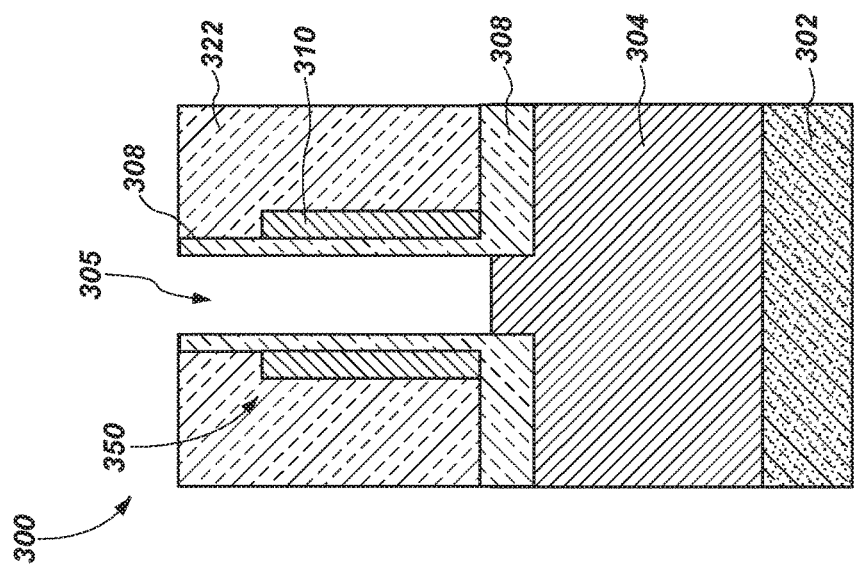

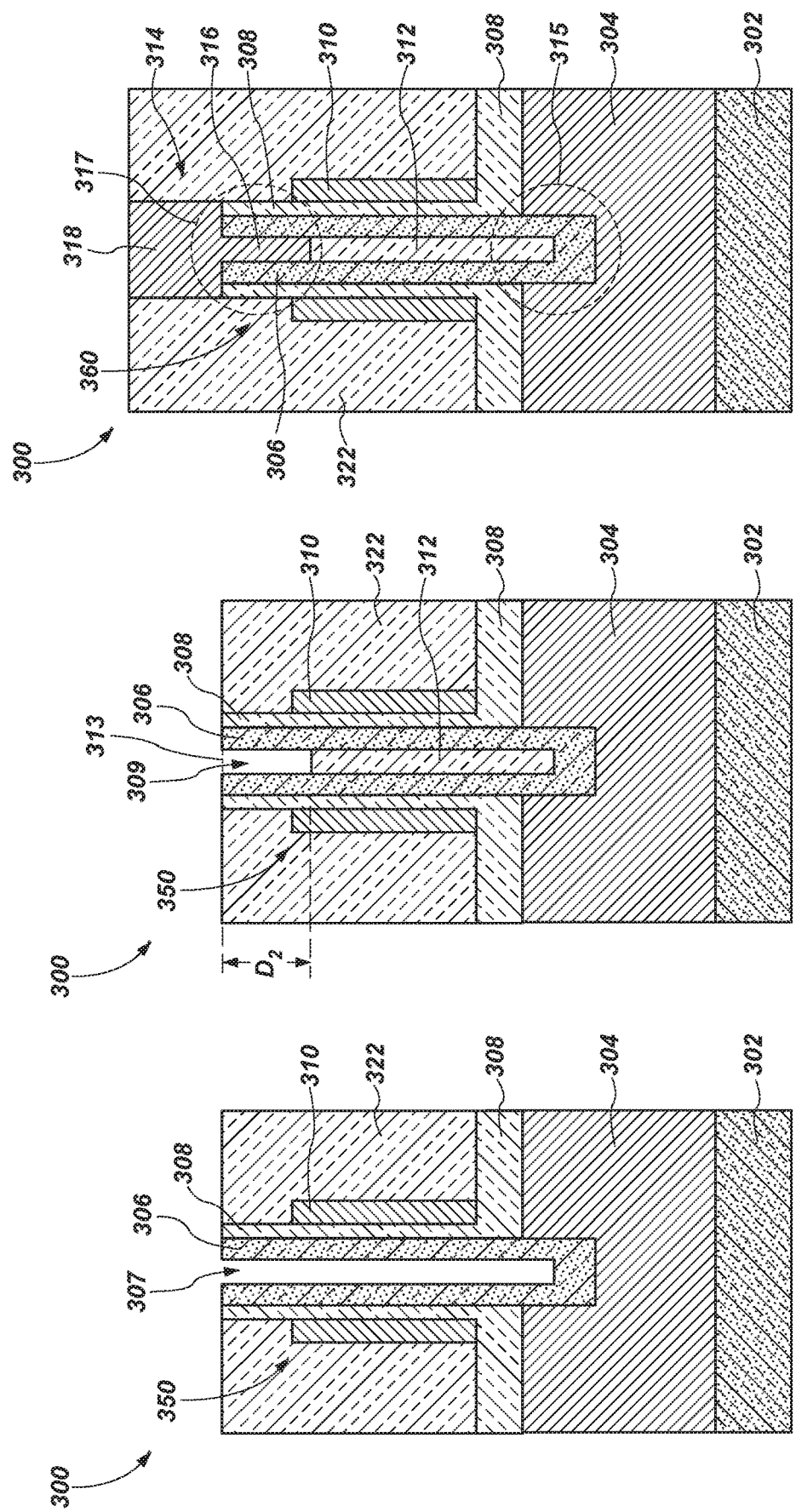

US 11,594,644 B2

MICROELECTRONIC DEVICES INCLUDING PASSIVATION MATERIALS, RELATED ELECTRONIC DEVICES, AND RELATED METHODS

TECHNICAL FIELD

Embodiments disclosed herein relate to microelectronic devices including transistors having a passivation material, to related electronic devices, and to related methods. More particularly, embodiments of the disclosure relate to microelectronic devices comprising features, such as transistors, having a channel material and a passivation material in contact with the channel material, to related electronic devices, and to related methods.

BACKGROUND

Fabrication of a microelectronic device includes forming transistors which may be used to access, for example, a storage component of a memory cell of the microelectronic device. The transistors include a channel region comprising a semiconductor material formulated and configured to conduct a current responsive to application of a threshold voltage and hinder the flow of current in the absence of the threshold voltage.

A continuing goal of the semiconductor industry has been to increase the memory density (e.g., the number of memory cells per memory die) of memory devices. While the footprint of the memory cells, including transistors, continues to be scaled down to increase the memory density of the memory device, decreasing the size of one or more components of the memory cells may negatively affect performance of the memory cells. For example, for a conventional transistor including a channel region formed of a semiconductor material (e.g., silicon, polysilicon), reducing a thickness of a gate dielectric material between the channel region and a gate electrode can initially decrease the off current ($I_{off}$) of the transistor. However, as the thickness of the gate dielectric material is decreased, a limit in the minimum thickness of the gate dielectric material is reached at which the off current begins to undesirably increase due to band-to-band tunneling and the relatively low band gap of the conventional semiconductor materials. In addition, the decreased size of the channel region may result in a reduced contact area between the channel region and conductive contacts. The reduced contact area results in an increased resistance between the channel region and the conductive contacts. The increased resistance causes the on-state current to decrease, which ultimately reduces the speed of the transistor and associated memory cell.

In microelectronic devices including vertical memory cells, the transistors associated with the vertical memory cells may be vertical. Forming such transistors includes forming a stack of materials that will eventually form the transistors of the vertical memory cell, the materials including source and drain contacts, channel regions, and gate electrode materials. The materials of the stack are patterned to form pillars including the stack of materials.

The channel regions of the vertical transistors include a semiconductor material. Traps and defects in the channel regions of conventional microelectronic devices including vertical transistors may increase the off current of the vertical transistors. In some instances, the traps and defects may result in the presence of so-called "sub-band gap" states (also referred to herein as "sub-gap" states). As one example, deep traps and deep donors may alter the off state leakage of the transistors. Accordingly, defects and traps in the channel regions may result in an increase in the off current of the transistors, reducing the charge retention ability of the transistor, such as by allowing the leakage of charge through the transistor in the off state. The increased leakage due to the increased off state current leakage results in leakage of stored charge through the transistors, necessitating a more frequent refresh of the memory bit associated with the transistor.

BRIEF DESCRIPTION OF THE DRAWINGS

FIG. 3A through FIG. 3F are simplified cross-sectional views illustrating a method of forming a microelectronic device, in accordance with embodiments of the disclosure;

DETAILED DESCRIPTION

Figure 1A:
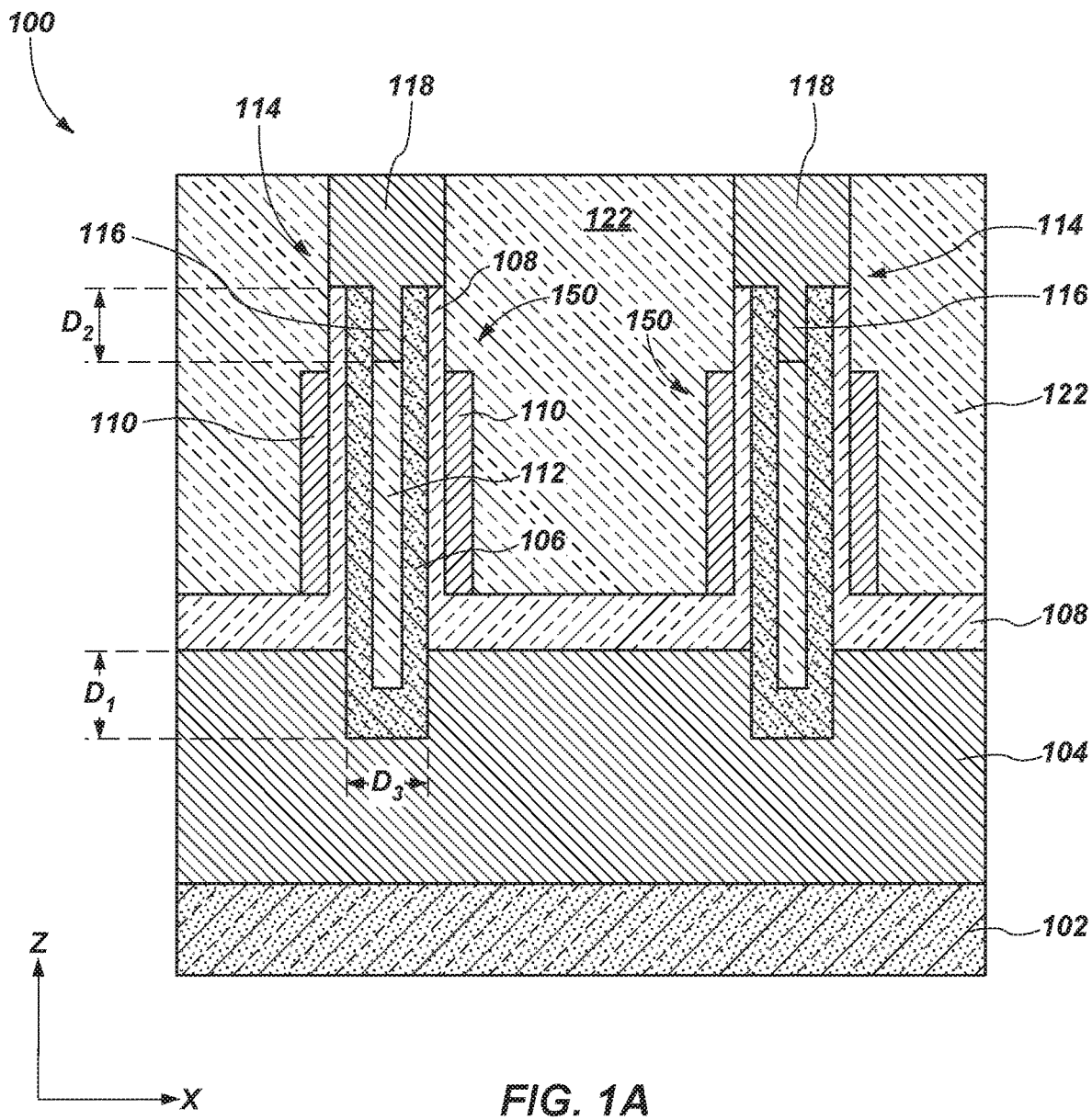
FIG. 1A and FIG. 1B are simplified cross-sectional views of a microelectronic device including a transistor, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a transistor, a microelectronic device including the transistor, or a complete description of a process flow for fabricating the transistor or microelectronic device including the transistor. The structures described below do not form complete microelectronic devices. Only those process acts and structures necessary to understand the embodiments described herein are described in detail below. Additional acts to form a complete microelectronic device including the transistors may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, an "electrically conductive material" refers to one or more of a metal, such as tungsten, titanium, niobium, vanadium, hafnium, tantalum, chromium, zirconium, iron, osmium, cobalt, nickel, iridium, platinum, palladium, ruthenium, rhodium, aluminum, copper, molybdenum, gold, a metal alloy, a metal-containing material (e.g., metal nitrides (titanium nitride, tantalum nitride, tungsten nitride, titanium aluminum nitride), metal silicides (tantalum silicides, tungsten silicides, nickel silicides, titanium silicides), metal carbides, metal oxides (iridium oxide, ruthenium oxide)), a conductively-doped semiconductor material (e.g., conductively-doped silicon, conductively-doped germanium, conductively-doped silicon germanium, etc.), polysilicon, other materials exhibiting electrical conductivity, or combinations thereof. Electrically conductive materials may include at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental ruthenium (Ru), elemental molybdenum (Mo), elemental iridium (Ir), iridium oxide ($IrO_x$), elemental ruthenium (Ru), ruthenium oxide ($RuO_x$), elemental tungsten (W), aluminum (Al), elemental copper (Cu), elemental gold (Au), elemental silver (Ag), polysilicon, alloys thereof, or combinations thereof. The terms "electrically conductive material" and "conductive material" may be used interchangeably herein.

According to embodiments described herein, a microelectronic device comprises an array of vertical transistors. The vertical transistors may be located between electrically conductive lines (e.g., bit lines, data lines). At least one of the vertical transistors includes a vertically oriented channel region comprising a channel material and a passivation material located between portions of the channel material. The channel material may extend at least partially into one of the electrically conductive lines. A portion of the channel material may directly contact the electrically conductive line such that the channel material contacts the electrically conductive line in three dimensions. In some embodiments, the channel material contacts the conductive line (e.g., along vertical sidewalls thereof) and along a lateral surface thereof. A dielectric material (e.g., a gate dielectric material) may surround at least a portion of the channel material. A conductive material (e.g., a gate electrode material) may be adjacent to and contact the dielectric material. The passivation material may be located within the channel material and between different portions (e.g., sidewalls) of the channel material. In some embodiments, the channel material includes an opening partially filled with the passivation material. The channel material may include an interface with the dielectric material and with the passivation material. Accordingly, the transistor may include a channel region including the channel material and the passivation material and may comprise a so-called "bilayer" structure including the channel material and the passivation material. A conductive contact (e.g., an electrode) may at least partially fill the opening and be located between different portions of the channel material. In some such embodiments, the conductive contact is in contact with the channel material in three dimensions, such as in the vertical direction (e.g., on sidewalls thereof) and in a lateral direction, such as along a lateral surface (e.g., a top surface) thereof.

Forming the channel material to extend into (e.g., partially into) the electrically conductive line and forming the conductive contact within the channel material and along (e.g., along sidewalls of) the channel material facilitates improved performance of the transistor. Forming the channel material in contact with the conductive line in three dimensions increases a contact area between the channel material and the conductive line. Similarly, forming the conductive contact at least partially within the channel material and contacting the channel material in three dimensions increases the contact area between the channel material and the conductive contact. The increased contact area between the channel material and each of the conductive line and the conductive contact reduces an electrical resistance of the contacts, which facilitates an improved on-state current and an improved operating speed of the transistor (e.g., a reduced RC value). Accordingly, a lateral footprint of the transistor may be reduced while improving the performance of the transistor.

The passivation material may facilitate a reduction in the off current of the transistor. The passivation material may be formulated and configured to passivate deep donor states (e.g., states within the band gap of the channel material with energy states between the energy state of the valence band and the conduction band and with a relatively high density of states) of the channel material and other defects in the channel material. Passivation of the deep donor states and the defects of the channel material may reduce an off state current of the transistor, reducing leakage through the transistor. In addition, the passivation material may reduce stress-induced degradation of the threshold voltage ($V_t$) of the transistor.

Figure 1B:
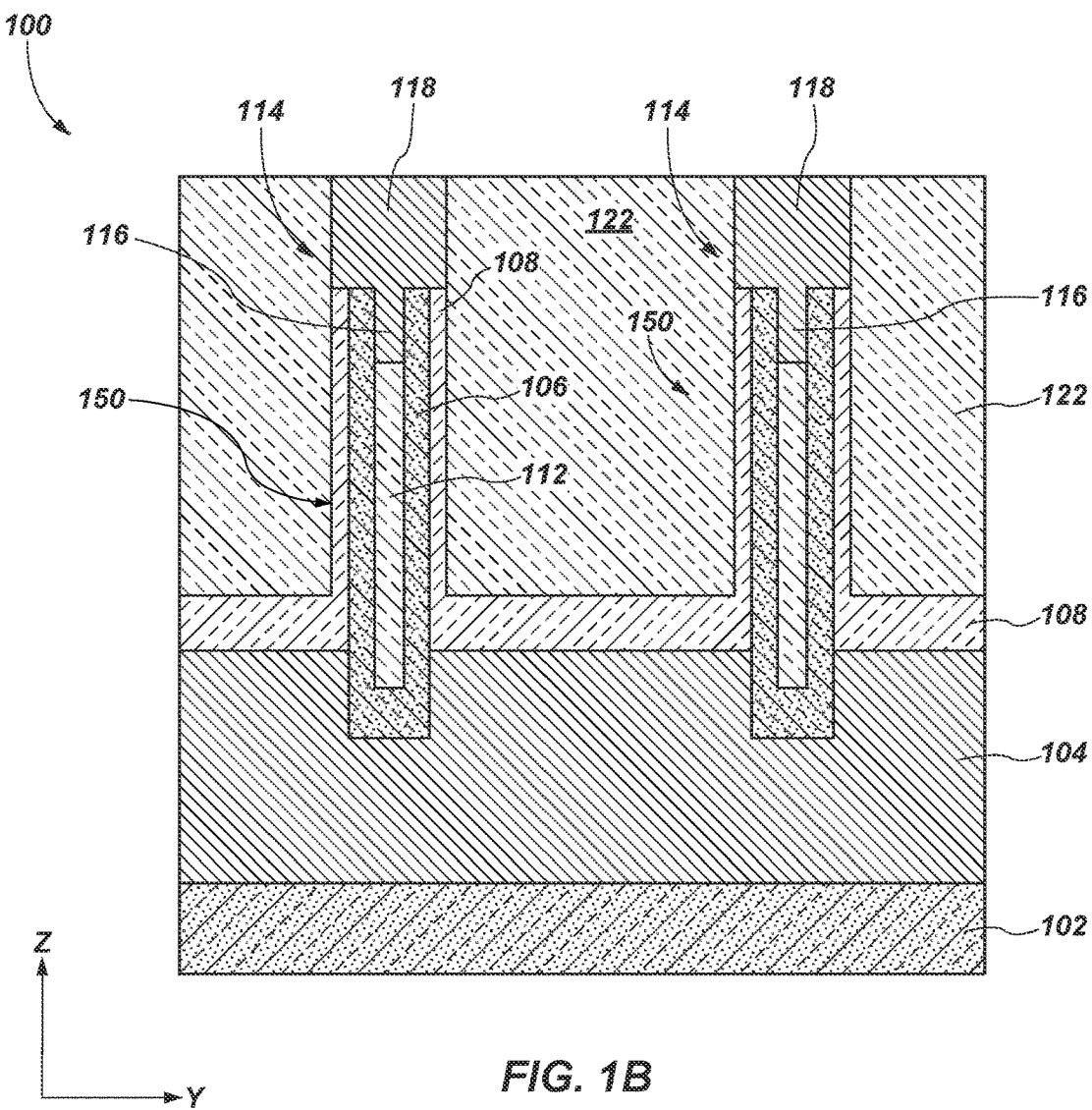

FIG. 1A and FIG. 1B are simplified cross-sectional views of a microelectronic device 100 including transistors 150, in accordance with embodiments of the disclosure. The transistors 150 may be adjacent to (e.g., overlie) a base material 102. The base material 102 may include a substrate or a construction upon which additional materials are formed. The base material 102 may be a semiconductor substrate, a base semiconductor layer on a supporting structure, a metal electrode, or a metal electrode on a semiconductor substrate having one or more layers, structures or regions formed thereon. The base material 102 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The base material 102 may be doped or undoped.

A conductive line 104 may be adjacent to (e.g., overlie) the base material 102. The conductive line 104 may include an electrically conductive material, such as tungsten, titanium, niobium, vanadium, hafnium, tantalum, chromium, zirconium, iron, osmium, cobalt, nickel, iridium, platinum, palladium, ruthenium, rhodium, aluminum, copper, molybdenum, gold, a metal alloy, a metal-containing material (e.g., metal nitrides (titanium nitride, tantalum nitride, tungsten nitride, titanium aluminum nitride)), metal silicides (tantalum silicides, tungsten silicides, nickel silicides, titanium silicides), metal carbides, metal oxides (iridium oxide, ruthenium oxide), a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive line 104 comprises tungsten.

The transistor 150 includes a channel material 106 extending at least partially into the conductive line 104. The channel material 106 may extend, for example, vertically (in the z-direction; up and down in the view of FIG. 1A and FIG. 1B) into the conductive line 104. A dielectric material 108 (e.g., a gate dielectric material) may be adjacent to (e.g., on sidewalls of) at least a portion of the channel material 106. The dielectric material 108 may also include portions adjacent to (e.g., overlying) the conductive line 104. The dielectric material 108 may extend along sides of the channel material 106. In some embodiments, an upper portion of the dielectric material 108 is coplanar with an upper portion of the channel material 106.

The dielectric material 108 may include one or more electrically insulative materials, such as, for example, phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), another material, or combinations thereof. In some embodiments, the dielectric material 108 comprises silicon dioxide.

A conductive material 110 (e.g., a gate electrode) (FIG. 1A) may be adjacent to (e.g., on sidewalls of) portions of the dielectric material 108. The conductive material 110 may be in direct contact with (e.g., direct contact with sidewalls of) the dielectric material 108. In some embodiments, the dielectric material 108 extends farther from the conductive line 104 than the conductive material 110. In other embodiments, the conductive material 110 is substantially coextensive with the dielectric material 108. With reference to FIG. 1A and FIG. 1B, the conductive material 110 may be located on two sides of the transistor 150. In some such embodiments, the transistor 150 may comprise a so-called "double gate" transistor. However, the disclosure is not so limited and the conductive material 110 may be located on only one side of the transistor 150. In some such embodiments, the transistor 150 may comprise a so-called "single-gate" transistor.

The conductive material 110 may include an electrically conductive material such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof.

As described above, the channel material 106 may extend along sidewalls of the dielectric material 108 and into a portion of the conductive line 104. In the cross-sectional views illustrated in FIG. 1A and FIG. 1B, the channel material 106 may have a substantially U-shaped cross-section. In some embodiments, the channel material 106 includes sidewalls extending along the dielectric material 108, the sidewalls defining an opening. In some such embodiments, the sidewalls of the channel material 106 may be separated from (e.g., spaced apart from) each other. As will be described herein, the opening between the sidewalls of the channel material 106 may include a passivation material 112. In other words, the passivation material 112 may separate (e.g., space) different portions of the channel material 106 from each other.

The channel material 106 may contact the conductive line 104 in three dimensions. For example, the channel material 106 may contact the conductive line 104 along a lateral surface of the conductive line 104 (e.g., in the x-y plane), and along vertical surfaces (sidewalls) of the conductive line 104 (e.g., in the x-z plane and in the y-z plane). By way of contrast, channel materials of conventional microelectronic devices only contact conductive lines or conductive contacts along lateral surfaces thereof.

The channel material 106 may extend into the conductive line 104 a distance $D_1$. The distance $D_1$ may be tailored to adjust a contact area between the channel material 106 and the conductive line 104. For example, increasing the distance $D_1$ increases a contact area between the channel material 106 and the conductive line 104 for a given area of the channel material 106 in the x-y plane. The distance $D_1$ may be within a range from about 0.5 nm to about 40 nm, such as from about 0.5 nm to about 1 nm, from about 1 nm to about 5 nm, from about 5 nm to about 10 nm, from about 10 nm to about 15 nm, from about 15 nm to about 20 nm, from about 20 nm to about 30 nm, or from about 30 nm to about 40 nm. However, the disclosure is not so limited and the distance $D_1$ may be different than those described. In some embodiments, the distance $D_1$ is within a range from about 10 nm to about 30 nm. In some embodiments, the distance $D_1$ is 0 and a lower portion of the channel material 106 is coplanar with the upper portion of the conductive line 104.

A distance $D_3$ between opposing outer sidewalls of the channel material 106 in the x-direction within a range from about 5 Å to about 20 nm, such as from about 5 Å to about 10 Å, from about 10 Å to about 2 nm, from about 2 nm to about 5 nm, from about 5 nm to about 10 nm, from about 10 nm to about 15 nm, or from about 15 nm to about 20 nm. In some embodiments, the distance $D_3$ corresponds to a diameter of the channel material 106 from one sidewall in contact with the dielectric material 108 to an opposing sidewall in contact with the dielectric material 108. In some embodiments, the distance $D_3$ corresponds to a distance between opposing sidewalls of the dielectric material 108.

The channel material 106 may comprise a material formulated to conduct current responsive to application of a suitable voltage (e.g., a threshold voltage, a set bias voltage, a read bias voltage) to the vertical transistor 150.

In some embodiments, the channel material 106 comprises a semiconductive material having a larger bandgap than polycrystalline silicon, such as a bandgap greater than about 1.65 electronvolts (eV), and may be referred to herein as a so-called "large bandgap material." For example, the channel material 106 may comprise an oxide semiconductor material, such as one or more of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_a$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), indium tungsten oxide (IWO), combinations thereof, and other similar materials. In some embodiments, the channel material 106 comprises IGZO. The channel material 106 may, for example, comprise a ternary oxide including atoms of two different elements as well as atoms of oxygen. In other embodiments, the channel material 106 comprises a quaternary oxide including atoms of three different elements and atoms of oxygen.

In other embodiments, the channel material 106 comprises silicon, n-doped silicon (e.g., silicon doped with one or more of arsenic ions, phosphorous ions, antimony ions), p-doped silicon (e.g., silicon doped with one or more of P-type dopants, such as boron), polysilicon, n-doped polysilicon, and p-doped polysilicon.

In yet other embodiments, the channel material 106 comprises a so-called "2D channel material." By way of non-limiting example, the 2D channel materials may include one or more of a transition metal di-chalcogenide (TMDC) having the general chemical formula $MX_2$, wherein M is a transition metal (e.g., molybdenum (Mo), tungsten (W), niobium (Nb), zirconium (Zr), hafnium (Hf), rhenium (Re), platinum (Pt), titanium (Ti), tantalum (Ta), vanadium (V), cobalt (Co) cadmium (Cd), chromium (Cr)) and X is a chalcogen (e.g., sulfur (S), selenium (Se), tellurium (Te)); a carbide or carbonitride having the general chemical formula $M_{n+1}X_n$ (also referred to as an "MXene") and including oxygen (—O), hydroxyl (—OH), or fluoro (—F) surface termination, wherein M is a transition metal from Groups IV or V of the Periodic Table of Elements (e.g., Ti, Hf, Zr, V, Nb, Ta) and X is selected from carbon (C) and nitrogen (N); graphene; graphene-oxide; stanine; phosphorene; hexagonal boron nitride (h-BN); borophene; silicene; graphyne; germanene; germanane; a 2D supracrystal; and a monolayer of a semiconductive material. In some embodiments, the channel material 106 comprises one or more TMDC monolayer(s), such as one or more monolayer(s) of one or more of tungsten sulfide ($WS_2$), tungsten selenide ($WSe_2$), tungsten telluride ($WTe_2$), molybdenum sulfide ($MoS_2$), molybdenum selenide ($MoSe_2$), molybdenum telluride ($MoTe_2$), niobium sulfide ($NbS_2$), niobium selenide ($NbSe_2$), niobium telluride ($NbTe_2$), zirconium sulfide ($ZrS_2$), zirconium selenide ($ZrSe_2$), zirconium telluride ($ZrTe_2$), hafnium sulfide ($HfS_2$), hafnium selenide ($HfSe_2$), hafnium telluride ($ZrTe_2$), rhenium sulfide ($ReS_2$), rhenium selenide ($ReSe_2$), and rhenium telluride ($ReTe_2$). By way of non-limiting example, the channel material 106 may comprise one or more of $WS_2$, $WSe_2$, $MoS_2$, and $MoSe_2$. In some embodiments, the channel material 106 is $WSe_2$. In addition embodiments, the channel material 106 is $WS_2$. In further embodiments, the channel material 106 is $MoSe_2$.

With reference again to FIG. 1A and FIG. 1B, the passivation material 112 may be located between portions of the channel material 106. In some embodiments, an interface between the passivation material 112 and the channel material 106 is lower (e.g., located more proximal to the base material 102) than an interface between the conductive line 104 and the dielectric material 108. The passivation material 112 and the channel material 106 may extend into the conductive line 104.

The passivation material 112 may be formulated and configured to alter an energy of trap states of the channel material 106 and reduce an off state current of the channel material 106. Without being bound by any particular theory, the passivation material 112 may passivate deep donor states of the channel material 106 by reducing a concentration of such states, facilitating an improvement in an off state current of the transistor 150 and reducing an off state current leakage of the transistor 150.

The passivation material 112 may include a dielectric material, such as one or more of yttrium oxide, silicon dioxide, aluminum oxide ($Al_2O_3$), zirconium oxide ($ZrO_2$), hafnium oxide ($HfO_2$), silicon nitride ($Si_xN_y$), silicon oxynitride (SiON), and silicon oxycarbide (SiOC). In some embodiments, the passivation material 112 comprises yttrium oxide ($Y_2O_3$). In some such embodiments, the channel material 106 may include an oxide semiconductor, such as IGZO. In other embodiments, the channel material 106 comprises polysilicon and the passivation material 112 comprises, for example, one or more of silicon dioxide, aluminum oxide, zirconium oxide, hafnium oxide, silicon nitride, silicon oxynitride, and silicon oxycarbide.

A conductive contact 114 (which may also be referred to as an electrode) may be adjacent to the channel material 106. The conductive contact 114 may overlie and contact the channel material 106. The conductive contact 114 may include a first portion 116 between two laterally adjacent portions of the channel material 106 and a second portion 118 over the first portion 116, the channel material 106, the dielectric material 108, and the passivation material 112. The first portion 116 may extend along and contact opposing sidewalls of the channel material 106. In other words, the first portion 116 may separate the opposing sidewalls of the channel material 106 from each other. Stated another way, the first portion 116 may extend in a vertical direction (e.g., in the z direction) and contact sidewalls of the channel material 106 between opposing sidewalls of the channel material 106. The conductive contact 114 may contact the channel material 106 in three dimensions. For example, the conductive contact 114 may contact the channel material 106 along lateral surfaces of the channel material 106 (e.g., in the x-y plane), and along vertical surfaces (sidewalls) of the channel material 106 (e.g., in the x-z plane and in the y-z plane). In some embodiments, the first portion 116 contacts the channel material 106 and the passivation material 112.

The first portion 116 may extend a distance $D_2$ into the channel material 106. The distance $D_2$ may be within a range of from about 0.5 nm to about 40 nm, such as from about 0.5 nm to about 1 nm, from about 1 nm to about 5 nm, from about 5 nm to about 10 nm, from about 10 nm to about 15 nm, from about 15 nm to about 20 nm, from about 20 nm to about 30 nm, or from about 30 nm to about 40 nm. However, the disclosure is not so limited and the distance $D_2$ may be different than those described. In some embodiments, the distance $D_2$ is within a range from about 10 nm to about 30 nm. In some embodiments, the distance $D_2$ is equal to about the distance $D_1$. In other embodiments, the distance $D_2$ is greater than the distance $D_1$. In yet other embodiments, the distance $D_2$ is less than the distance $D_1$. In some embodiments, the distance $D_2$ is 0 and the conductive contact 114 does not include the first portion 116 extending into the channel material 106.

The second portion 118 may be adjacent to (e.g., overlie) the first portion 116 and may be located distal to the conductive line 104 relative to the first portion 116. The second portion 118 may contact each of the first portion 116, the channel material 106, and the dielectric material 108.

The conductive contact 114 (e.g., the first portion 116 and the second portion 118) may include an electrically conductive material. For example, the conductive contact 114 may include tungsten, titanium, niobium, vanadium, hafnium, tantalum, chromium, zirconium, iron, osmium, cobalt, nickel, iridium, platinum, palladium, ruthenium, rhodium, aluminum, copper, molybdenum, gold, a metal alloy, a metal-containing material (e.g., metal nitrides (titanium nitride, tantalum nitride, tungsten nitride, titanium aluminum nitride)), metal silicides (tantalum silicides, tungsten silicides, nickel silicides, titanium silicides), metal carbides, metal oxides (iridium oxide, ruthenium oxide), a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive contact 114 comprises the same material composition as the conductive line 104. In some embodiments, the conductive contact 114 comprises tungsten.

The channel material 106 may comprise a semiconductor material formulated and configured to exhibit electrical conductivity responsive to application of a suitable voltage (e.g., a threshold voltage $V_t$) to the transistor 150 (e.g., between the conductive material 110 and a source region (e.g., the conductive line 104)). In some embodiments, the channel material 106 is in electrical communication with the conductive line 104 and the conductive contact 114. In some embodiments, the conductive line 104 and the conductive contact 114 may each individually be referred to herein as a so-called source contact or a so-called drain contact. In some such embodiments, the channel material 106 is in electrical communication with each of a source region and a drain region of the transistor 150.

An electrically insulative material 122 may surround the transistors 150 and electrically isolate adjacent transistors 150 from each other. The electrically insulative material 122 may include, for example, phosphosilicate glass, borosilicate glass, borophosphosilicate glass (BPSG), fluorosilicate glass, silicon dioxide, titanium dioxide, a nitride material, (e.g., silicon nitride ($Si_3N_4$)), an oxynitride (e.g., silicon oxynitride), another dielectric material, a dielectric carbon nitride material (e.g., silicon carbon nitride (SiCN)), a dielectric carboxynitride material (e.g., silicon carboxynitride (SiOCN)), or combinations thereof. In some embodiments, the electrically insulative material 122 comprises silicon dioxide. In some embodiments, the electrically insulative material 122 comprises the same material as the dielectric material 108.

In use and operation, the passivation material 112 facilitates a reduction in the off current of the transistor 150. The passivation material 112 may passivate defects (e.g., deep traps, deep donors) within the channel material 106 and reduce a concentration of sub-gap states within the channel material 106 and reduce or prevent sub-gap states and leaking of the channel material 106.

Forming the channel material 106 to be at least partially surrounded by the conductive line 104 and forming the first portion 116 of the conductive contact 114 within the channel material 106 may facilitate a reduction in a contact resistance between the channel material 106 and the respective one of the conductive line 104 and the conductive contact 114. Accordingly, a lateral footprint of the transistor 150 may be reduced, while increasing or maintaining a contact area between the channel material 106 and conductive materials adjacent to the channel material 106. The increased contact area may reduce a contact resistance between the channel material 106 and the conductive materials, increasing the speed and performance of the transistor.

Figure 2:
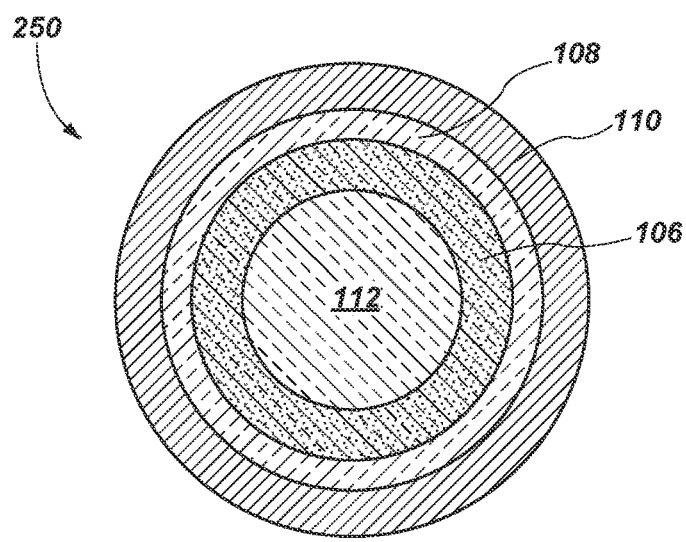
FIG. 2 is a simplified planar cross-sectional view of a transistor of a microelectronic device, in accordance with embodiments of the disclosure.

Although FIG. 1A and FIG. 1B have been described and illustrated as including the conductive material 110 on two sides of the transistor 150, the disclosure is not so limited. FIG. 2 is a simplified planar cross-sectional view of a transistor 250. The transistor 250 may include the conductive material 110 substantially surrounding (e.g., around) all sides thereof. The transistor 250 may include the channel material 106 surrounding the passivation material 112, the dielectric material 108 surrounding the channel material 106, and the conductive material 110 surrounding the dielectric material 108. Since the conductive material 110 surrounds substantially all of the dielectric material 108, the transistor 150 comprise a so-called "gate all around" (GAA) transistor.

In other embodiments, the conductive material 110 may be located on three sides of the dielectric material 108. In some such embodiments, the transistor may comprise a so-called "triple gate" or a "tri-gate" transistor. In yet other embodiments, the conductive material 110 may be located on only one side of the transistor 150 and the transistor 150 may comprise a single-gate transistor.

Accordingly, in at least some embodiments, a microelectronic device comprises a transistor adjacent to a conductive line. The transistor comprises a channel material extending into and in contact with the conductive line, a dielectric material adjacent to the channel material, a conductive material adjacent to the dielectric material, and a passivation material adjacent to the channel material. The microelectronic device further comprises a conductive contact adjacent to the channel material, the conductive contact including a portion extending between opposing portions of the channel material.

Accordingly, in some embodiments, a microelectronic device comprises a transistor comprising a channel material extending into a conductive line, a passivation material located between different portions of the channel material, a dielectric material adjacent to the channel material, and a conductive material adjacent to the dielectric material, the dielectric material between the channel material and the conductive material.

Accordingly, in some embodiments, a microelectronic device comprises a conductive line, a passivation material adjacent to the conductive line, a channel material comprising an oxide semiconductor adjacent in contact with opposing sides of the passivation material, a dielectric material in contact with the channel material, and a conductive material adjacent to the dielectric material.

FIG. 3A through FIG. 3F illustrate a method of forming the microelectronic device 100 of FIG. 1A and FIG. 1B, in accordance with embodiments of the disclosure. Referring to FIG. 3A, a microelectronic device 300 may include structures 350 adjacent to (e.g., over) a base material 302. The base material 302 may include the same materials described above with reference to the base material 102.

The structures 350 may include a dielectric material 308, a conductive material 310, and an electrically insulative material 322 adjacent to (e.g., over) a conductive line 304. The conductive line 304 may include one or more of the materials described above with reference to the conductive line 104 and the dielectric material 308 may include one or more of the materials described above with reference to the dielectric material 108. A conductive material 310 may be adjacent to the dielectric material 308. The conductive material 310 may include one or more of the materials described above with reference to the conductive material 110. An electrically insulative material 322, which may include one or more of the materials described above with reference to the electrically insulative material 122, may electrically isolate adjacent structures 350 from each other. In some embodiments, the structures 350 are formed by conventional techniques.

A sacrificial material 305 may be formed between portions of the dielectric material 308, such as between opposing sidewalls of the dielectric material 308. The sacrificial material 305 may include, for example, one or more of polysilicon, silicon nitride, silicon oxynitride, and a polymer material (e.g., a poly(p-xylene) polymer, such as Parylene). In some embodiments, the sacrificial material 305 comprises polysilicon.

Referring to FIG. 3B, the sacrificial material 305 (FIG. 3A) may be removed (e.g., etched, exhumed) to form openings 307 and expose a portion of the conductive line 304 and sidewalls of the dielectric material 308. The openings 307 may be defined by sidewalls of the dielectric material 308 and an upper surface of the conductive line 304. By way of non-limiting example, the sacrificial material 305 may be exposed to one or more of nitric acid, hydrofluoric acid, water, and tetramethyl ammonium hydroxide (TMAH) to remove the sacrificial material 305 and form the openings 307. In other embodiments, the sacrificial material 305 is removed by dry etching, such as by exposing the sacrificial material 305 to a plasma comprising one or more of chlorine, hydrogen bromide, oxygen, and sulfur hexafluoride ($SF_6$).

With reference to FIG. 3C, a portion of the conductive line 304 may be removed to extend the opening 307 into the conductive line 304. Removing the portion of the conductive line 304 may extend the opening 307 the distance $D_1$ from an interface 311 between the conductive line 304 and the dielectric material 308. The extended openings 307 may be defined by the sidewalls of the dielectric material 308, exposed sidewalls of the conductive line 304, and an exposed upper surface of the conductive line 304.

The portion of the conductive line 304 may be removed by, for example, dry etching (e.g., reactive ion etching (RIE)), wet etching, or by another method. By way of non-limiting example, the portion of the conductive line 304 may be removed by exposing the exposed portion of the conductive line 304 to one or more of hydrofluoric acid, nitric acid, ammonium hydroxide and hydrogen peroxide, sulfuric acid, and hydrochloric acid. In other embodiments, the portion of the conductive line 304 is removed by exposing the exposed portion of the conductive line 304 to one or more of sulfur hexafluoride, carbon tetrafluoride ($CF_4$), bromotrifluoromethane ($CBrF_3$), fluoroform ($CHF_3$), oxygen, and nitrogen trifluoride ($NF_3$). However, the disclosure is not so limited and the portion of the conductive line 304 may be removed by methods other than those described.

In some embodiments, after removing the portion of the conductive line 304, the microelectronic device 300 may be exposed to a cleaning chemistry to remove conductive material that may have resputtered on surfaces (e.g., sidewalls) of the dielectric material 308 during removal of the portion of the conductive line 304. A portion of the dielectric material 308 may also be removed by the cleaning chemistry and an additional portion of the dielectric material 308 may be reformed to facilitate a substantially pure dielectric material 308.

Referring to FIG. 3D, a channel material 306 may be formed within the opening 307, such as along sidewalls of the opening 307 and over exposed surfaces of the conductive line 304. Forming the channel material 306 within the opening 307 may not substantially fill the opening 307. In other words, portions of the channel material 306 on opposing sidewalls of the opening 307 may be separated (e.g., spaced) from each other such that the channel material 306 has a substantially U-shaped cross-section. The channel material 306 may be formed by one or more of ALD, CVD, PEALD, PVD, PECVD, and LPCVD.

The channel material 306 may include one or more of the materials described above with reference to the channel material 106. In some embodiments, the channel material 306 comprises an oxide semiconductor material, such as IGZO.

The channel material 306 may contact the conductive line 304 in three dimensions. For example, the channel material 306 may contact vertical sidewalls of the conductive line 304 and may also contact the conductive line 304 along a surface that is substantially parallel with the interface 311 (FIG. 3C) between the dielectric material 308 and the conductive line 304. In some embodiments, the channel material 306 contacts the conductive line 304 in three dimensions.

With reference to FIG. 3E, after forming the channel material 306, a passivation material 312 may be formed within the channel material 306 and within the opening 307 (FIG. 3D). The passivation material 312 may at least partially fill the opening 307. In some embodiments, the passivation material 312 may substantially fill the opening 307 and may include an upper surface that is coplanar with an upper surface of the channel material 306, which may also be coplanar with an upper surface of the insulative material 322, as indicated by dashed line 313. The passivation material 312 may be formed by one or more of ALD, CVD, PEALD, PVD, PECVD, and LPCVD.

The passivation material 312 may include one or more of the materials described above with reference to the passivation material 112. In some embodiments, the passivation material 312 comprises yttrium oxide.

After forming the passivation material 312, an upper portion of the passivation material 312 may be removed to recess the passivation material 312 and form an opening 309 between the opposing sidewalls of the channel material 306. Recessing the passivation material 312 may leave an exposed surface of the passivation material 312 between opposite sidewalls of the channel material 306 within the opening 309. The passivation material 312 may be recessed the distance $D_2$ from a major surface of the electrically insulative material 322.

The upper portion of the passivation material 312 may be removed by, for example, exposing the passivation material 312 to a plasma comprising one or more of carbon tetrafluoride and oxygen, boron trichloride ($BCl_3$), hydrogen bromide gas, and chlorine. In other embodiments, the upper portion of the passivation material 312 may be removed by, for example, exposing the passivation material 312 to one or more of hydrochloric acid, nitric acid, and sulfuric acid. However, the disclosure is not so limited and the upper portion of the passivation material 312 may be removed by methods other than those described above.

Referring to FIG. 3F, in some embodiments, additional electrically insulative material 322 may be formed and patterned over the microelectronic device 300, such as over exposed portions of the electrically insulative material 322.

A conductive contact 314 may be formed over the recessed passivation material 312, the channel material 306, and the dielectric material 308 of the microelectronic device 300 to form a transistor 360. In some embodiments, the conductive contact 314 includes a first portion 316 that substantially fills the opening 309 (FIG. 3E) and a second portion 318 over the first portion 316 and over the opening 309. The conductive contact 314 may be formed by one or more of ALD, CVD, PEALD, PVD, PECVD, and LPCVD.

The conductive contact 314 may include one or more of the materials described above with reference to the conductive contact 114. In some embodiments, the conductive contact 314 comprises tungsten.

After forming the conductive contact 314 over the microelectronic device 300, the microelectronic device 300 may be exposed to a chemical mechanical planarization process to planarize upper surfaces of the electrically insulative material 322 and the conductive contact 314 (e.g., upper surfaces of the second portion 318).

Forming the microelectronic device 300 to include the channel material 306 extending (e.g., in the vertical direction) into the conductive line 304 and to include the first portion 316 of the conductive contact 314 extending (e.g., in the vertical direction) along sidewalls of the channel material 306 facilitates increased contact areas between the channel material 306 and each of the conductive line 304 and the conductive contact 314. For example, the channel material 306 may exhibit an increased contact area with the conductive line 304, as indicated by dashed circle 315 and an increased contact area with the conductive contact 314, as indicated by dashed circle 317. The microelectronic device 300 according to embodiments of the disclosure may exhibit an increased contact area of about three times greater than that of a conventional transistor formed at the same pitch and footprint. Of course, the contact area may depend on the depths $D_1$ and $D_2$. The increased contact areas may facilitate an improved (e.g., reduced) contact resistance between the channel material 306 and each of the conductive line 304 and the conductive contact 314. The reduced contact resistance may increase the operating speed of the transistor.

In addition, forming the passivation material 312 between opposing portions of the U-shaped channel material 306 may reduce an off current of the transistor. Without being bound by any theory, it is believed that the passivation material 312 passivates defects (e.g., deep traps, deep donors) within the channel material 306 and reduces a concentration of sub-gap states within the channel material 306 and reduces or prevents sub-gap states and leaking of the channel material 306.

After forming the conductive contact 314, the microelectronic device 300 may be further processed, such as by, for example, forming a memory element in electrical communication with the conductive contact 314. As only one example, a capacitor structure (not shown) may be formed over and in electrical communication with the conductive contact 314. In some such embodiments, the conductive contact 314 may be in electrical communication with, for example, an electrode of the capacitor structure. A dielectric material may be formed adjacent to the electrode and another electrode may be formed adjacent to the dielectric material. However, the disclosure is not so limited and structures other than, or in addition to, capacitor structures may be formed in electrical communication with the conductive contact 314.

Accordingly, in at least some embodiments, a method of forming a microelectronic device comprises removing a sacrificial material between adjacent portions of a dielectric material to form an opening and expose a conductive line through the opening, removing a portion of the conductive line through the opening, forming a channel material within the opening and in contact with the conductive line, forming a passivation material adjacent to the channel material, and forming a conductive contact adjacent to the channel material and the passivation material.

Figure 4:
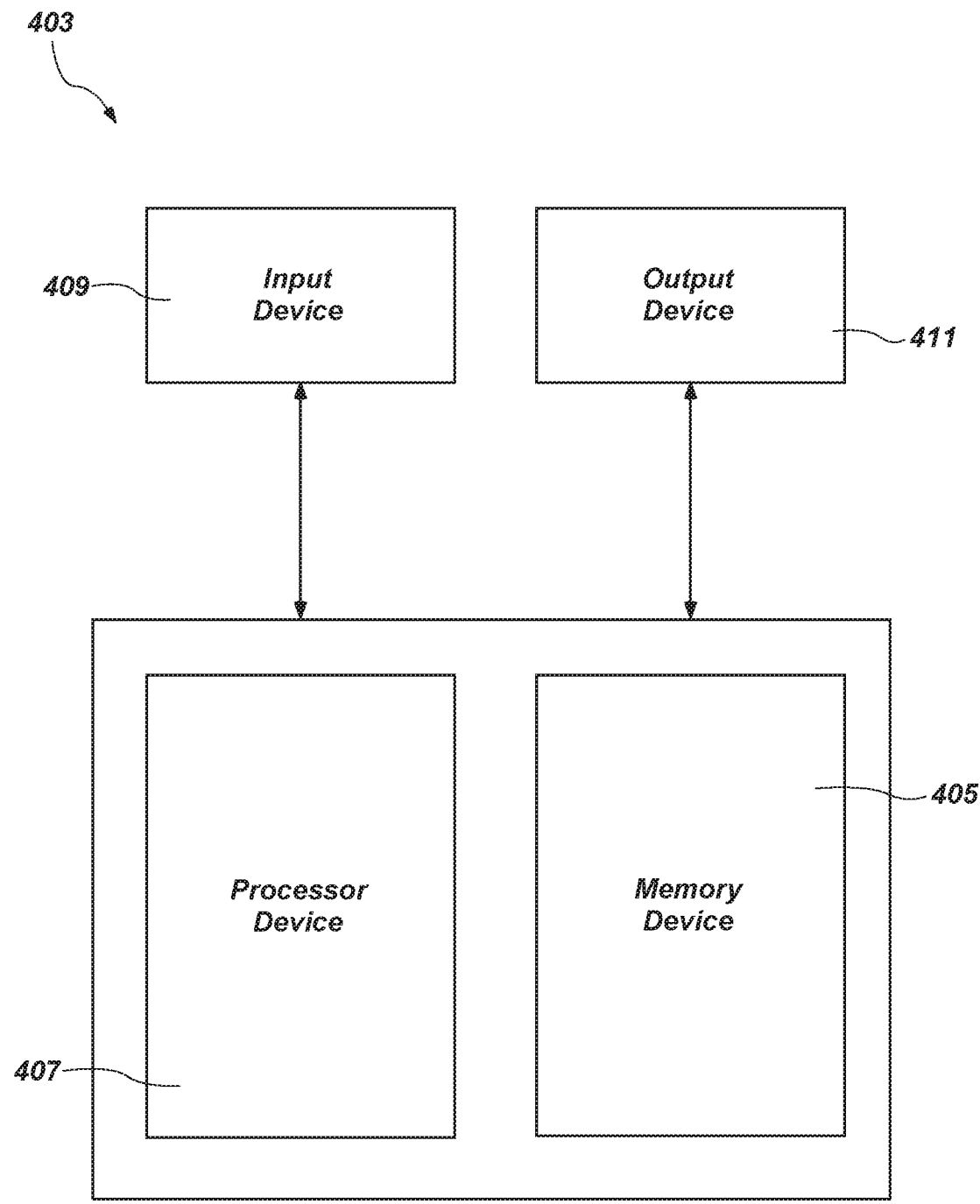
FIG. 4 is a block diagram of an electronic system, in accordance with embodiments of the disclosure.

Microelectronic devices (e.g., the microelectronic devices 100, 300) including the transistors (e.g., the transistors 150, 250, 360) in accordance with embodiments of the disclosure may be used in embodiments of electronic systems of the disclosure. For example, FIG. 4 is a block diagram of an illustrative electronic system 403 according to embodiments of disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of a microelectronic device previously described herein (e.g., microelectronic devices 100, 300) including a channel material (e.g., the channel material 106, 306) and a passivation material (e.g., the passivation material 112, 312) adjacent to the channel material.

The electronic system 403 may further include at least one electronic signal processor device 407 (often referred to as a "microprocessor"). The electronic signal processor device 407 may, optionally, include an embodiment of a microelectronic device previously described herein (e.g., the microelectronic devices 100, 300). The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

Figure 5:
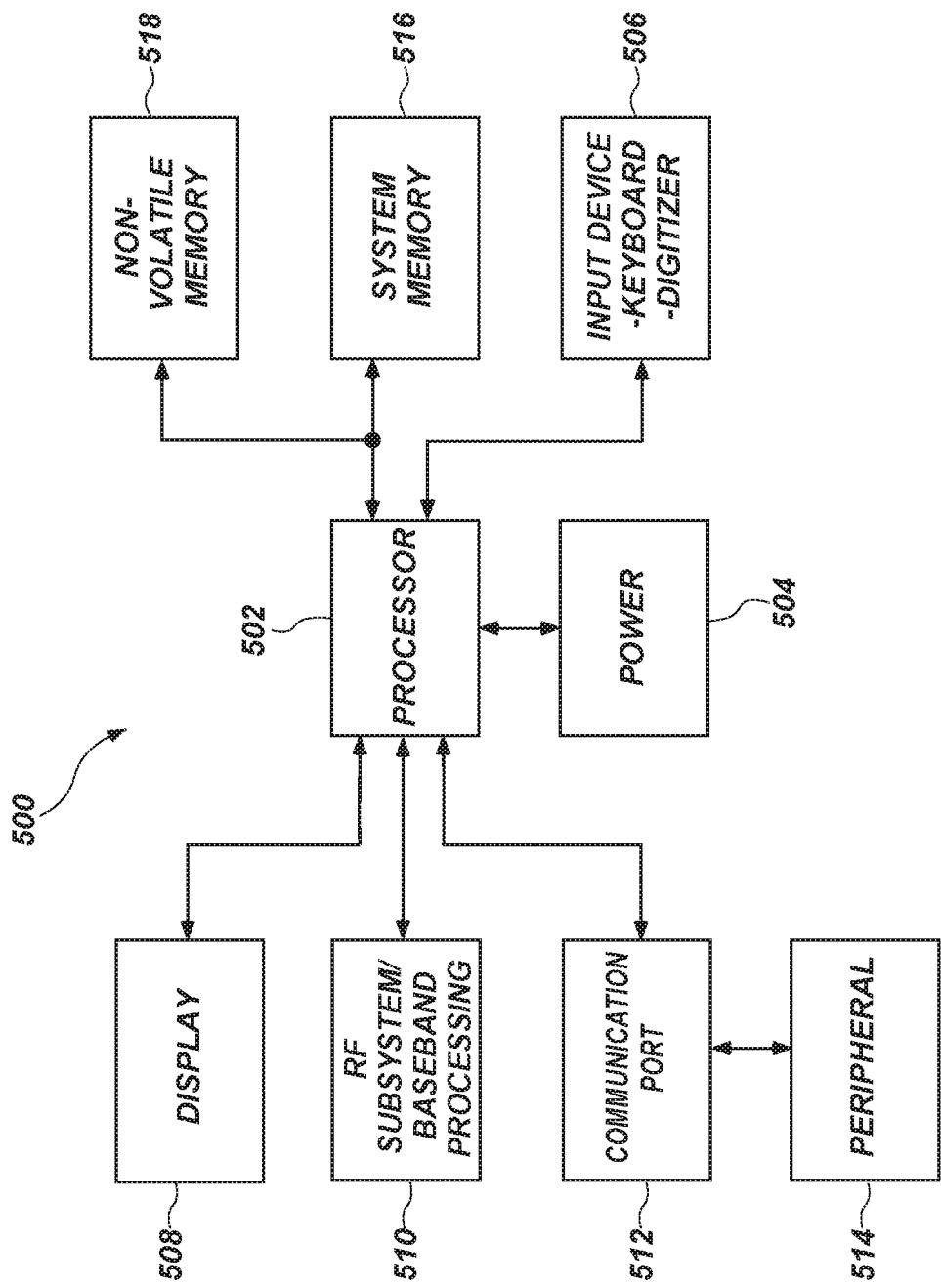
FIG. 5 is a processor-based system, in accordance with embodiments of the disclosure.

With reference to FIG. 5, depicted is a processor-based system 500. The processor-based system 500 may include various electronic devices (e.g., microelectronic devices 100, 300) manufactured in accordance with embodiments of the present disclosure. The processor-based system 500 may be any of a variety of types such as a computer, pager, cellular phone, personal organizer, control circuit, or other electronic device. The processor-based system 500 may include one or more processors 502, such as a microprocessor, to control the processing of system functions and requests in the processor-based system 500. The processor 502 and other subcomponents of the processor-based system 500 may include microelectronic devices (e.g., microelectronic devices 100, 300) manufactured in accordance with embodiments of the present disclosure.

The processor-based system 500 may include a power supply 504 in operable communication with the processor 502. For example, if the processor-based system 500 is a portable system, the power supply 504 may include one or more of a fuel cell, a power scavenging device, permanent batteries, replaceable batteries, and rechargeable batteries. The power supply 504 may also include an AC adapter; therefore, the processor-based system 500 may be plugged into a wall outlet, for example. The power supply 504 may also include a DC adapter such that the processor-based system 500 may be plugged into a vehicle cigarette lighter or a vehicle power port, for example.

Various other devices may be coupled to the processor 502 depending on the functions that the processor-based system 500 performs. For example, a user interface 506 may be coupled to the processor 502. The user interface 506 may include input devices such as buttons, switches, a keyboard, a light pen, a mouse, a digitizer and stylus, a touch screen, a voice recognition system, a microphone, or a combination thereof. A display 508 may also be coupled to the processor 502. The display 508 may include an LCD display, an SED display, a CRT display, a DLP display, a plasma display, an OLED display, an LED display, a three-dimensional projection, an audio display, or a combination thereof. Furthermore, an RF sub-system/baseband processor 510 may also be coupled to the processor 502. The RF sub-system/baseband processor 510 may include an antenna that is coupled to an RF receiver and to an RF transmitter (not shown). A communication port 512, or more than one communication port 512, may also be coupled to the processor 502. The communication port 512 may be adapted to be coupled to one or more peripheral devices 514, such as a modem, a printer, a computer, a scanner, or a camera, or to a network, such as a local area network, remote area network, intranet, or the Internet, for example.

The processor 502 may control the processor-based system 500 by implementing software programs stored in the memory. The software programs may include an operating system, database software, drafting software, word processing software, media editing software, or media playing software, for example. The memory is operably coupled to the processor 502 to store and facilitate execution of various programs. For example, the processor 502 may be coupled to system memory 516, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 516 may include volatile memory, non-volatile memory, or a combination thereof. The system memory 516 is typically large so that it can store dynamically loaded applications and data. In some embodiments, the system memory 516 may include semiconductor devices, such as the microelectronic devices (e.g., the microelectronic devices 100, 300) described above, or a combination thereof.

The processor 502 may also be coupled to non-volatile memory 518, which is not to suggest that system memory 516 is necessarily volatile. The non-volatile memory 518 may include one or more of STT-MRAM, MRAM, read-only memory (ROM) such as an EPROM, resistive read-only memory (RROM), and flash memory to be used in conjunction with the system memory 516. The size of the non-volatile memory 518 is typically selected to be just large enough to store any necessary operating system, application programs, and fixed data. Additionally, the non-volatile memory 518 may include a high-capacity memory such as disk drive memory, such as a hybrid-drive including resistive memory or other types of non-volatile solid-state memory, for example. The non-volatile memory 518 may include microelectronic devices, such as the microelectronic devices (e.g., the microelectronic devices 100, 300) described above, or a combination thereof.

Accordingly, in some embodiments, an electronic device comprises an input device, an output device, a processor device operably coupled to the input device and the output device, and a memory device operably coupled to the processor device. The memory device comprises a channel material extending along a conductive line, a passivation material within adjacent portions of the channel material, a dielectric material adjacent to the channel material, and a conductive material adjacent to the dielectric material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a transistor adjacent to a conductive line, the transistor comprising:
a channel material extending into and in contact with the conductive line along a vertical direction;
a dielectric material adjacent to the channel material;
a conductive material adjacent to the dielectric material; and
a passivation material adjacent to the channel material; and
a conductive contact adjacent to the channel material, the conductive contact including a portion extending between opposing portions of the channel material.

2. The microelectronic device of claim 1, wherein the passivation material is between the opposing portions of the channel material.

3. The microelectronic device of claim 1, wherein the channel material is between the passivation material and the dielectric material.

4. The microelectronic device of claim 1, wherein the passivation material is spaced from the conductive material and comprises yttrium oxide.

5. The microelectronic device of claim 4, wherein the channel material comprises an oxide semiconductor material.

6. The microelectronic device of claim 4, wherein the channel material comprises indium gallium zinc oxide.

7. The microelectronic device of claim 1, wherein the channel material extends into the conductive line a depth within a range from about 10 nm to about 30 nm.

8. The microelectronic device of claim 1, wherein the portion of the conductive contact extending between opposing portions of the channel material extends a depth within a range from about 10 nm to about 30 nm into the channel material.

9. The microelectronic device of claim 1, wherein an interface between the passivation material and the channel material is lower than an interface between the conductive line and the dielectric material.

10. The microelectronic device of claim 1, wherein the channel material contacts the conductive line in at least two planes.

11. A microelectronic device, comprising:
a transistor comprising a channel material extending into a conductive line;
a passivation material located between different portions of the channel material;
a dielectric material directly contacting the channel material and the conductive line; and
a conductive material adjacent to the dielectric material, the dielectric material between the channel material and the conductive material.

12. The microelectronic device of claim 11, further comprising a conductive contact adjacent to the channel material.

13. The microelectronic device of claim 11, wherein the conductive line comprises at least two interfaces with the channel material.

14. The microelectronic device of claim 11, wherein the passivation material comprises yttrium oxide.

15. The microelectronic device of claim 11, wherein the conductive material surrounds the dielectric material.

16. The microelectronic device of claim 11, wherein the channel material contacts the conductive line in a first plane and in a second plane intersecting the first plane.

17. A method of forming a microelectronic device, the method comprising:
removing a sacrificial material between adjacent portions of a dielectric material to form an opening and expose a conductive line through the opening, the dielectric material adjacent to a conductive material;
removing a portion of the conductive line through the opening;
forming a channel material within the opening and in contact with the conductive line;
forming a passivation material adjacent to the channel material; and
forming a conductive contact adjacent to the channel material and the passivation material to form a microelectronic device comprising:
a transistor comprising the channel material extending into the conductive line;
the passivation material located between different portions of the channel material;
the dielectric material directly contacting the channel material and the conductive line; and
a conductive material adjacent to the dielectric material, the dielectric material between the channel material and the conductive material.

18. The method of claim 17, wherein forming a conductive contact adjacent to the channel material comprises forming the conductive contact in contact with sidewalls of the channel material.

19. The method of claim 17, further comprising recessing a portion of the passivation material prior to forming the conductive contact adjacent to the channel material and the passivation material.

20. The method of claim 19, wherein recessing a portion of the passivation material comprises removing a portion of the passivation material relative to the channel material.

21. The method of claim 17, wherein:
forming a channel material comprises forming a channel material comprising an oxide semiconductor; and
forming a passivation material comprises forming yttrium oxide.

22. The method of claim 17, wherein forming a passivation material adjacent to the channel material comprises forming the passivation material between opposing portions of the channel material.

23. The method of claim 17, wherein forming a conductive contact adjacent to the channel material and the passivation material comprises forming a first portion of the conductive contact between opposing portions of the channel material and a second portion of the conductive contact over the channel material.

24. A microelectronic device, comprising:
a conductive line;
a passivation material adjacent to the conductive line;
a channel material comprising an oxide semiconductor in contact with opposing sides of the passivation material, the passivation material spaced from the conductive line by the channel material;

a dielectric material in contact with the channel material; and a conductive material adjacent to the dielectric material.

25. The microelectronic device of claim 24, wherein the passivation material comprises yttrium oxide.

26. An electronic device, comprising:
- an input device;
- an output device;
- a processor device operably coupled to the input device and the output device; and
- a memory device operably coupled to the processor device and comprising:
  - a channel material extending along a conductive line;
  - a passivation material within adjacent portions of the channel material;
  - a dielectric material adjacent to the channel material; and
  - a conductive material adjacent to the dielectric material, the channel material directly contacting the passivation material, the dielectric material, and the conductive line.

27. The electronic device of claim 26, further comprising a conductive contact in contact with sidewalls of the adjacent portions of the channel material.

* * * * *

UNITED STATES PATENT AND TRADEMARK OFFICE
CERTIFICATE OF CORRECTION

PATENT NO. : 11,594,644 B2
APPLICATION NO. : 16/682617
DATED : February 28, 2023
INVENTOR(S) : Kamal M. Karda and Haitao Liu It is certified that error appears in the above-identified patent and that said Letters Patent is hereby corrected as shown below:

In the Specification
Column 7, Line 58, change "$Al_xSn_yIn_zZn_aO_a$" to --$Al_xSn_yIn_zZn_aO_d$--

Signed and Sealed this
Fifteenth Day of August, 2023

Katherine Kelly Vidal
*Director of the United States Patent and Trademark Office*